United States Patent
Zhang et al.

(10) Patent No.: US 9,417,962 B2
(45) Date of Patent: Aug. 16, 2016

(54) DATA BLOCK SUB-DIVISION BASED DATA RECOVERY METHOD AND DEVICE

(71) Applicant: Huawei Technologies Co., Ltd., Shenzhen (CN)

(72) Inventors: Wei Zhang, Shenzhen (CN); Feng Zhang, Shenzhen (CN); Xiaosong Lei, Shenzhen (CN); Rui Xiang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 13 days.

(21) Appl. No.: 14/714,754

(22) Filed: May 18, 2015

(65) Prior Publication Data

US 2015/0301891 A1  Oct. 22, 2015

Related U.S. Application Data

(63) Continuation of application No. PCT/CN2012/085155, filed on Nov. 23, 2012.

(51) Int. Cl.
*G06F 11/10* (2006.01)
*H03M 13/15* (2006.01)

(52) U.S. Cl.
CPC ........ *G06F 11/1076* (2013.01); *G06F 11/1008* (2013.01); *H03M 13/154* (2013.01); *G06F 11/1084* (2013.01); *G06F 11/1096* (2013.01)

(58) Field of Classification Search
CPC . G06F 11/10; G06F 11/1004; G06F 11/1008; G06F 11/1068; G06F 11/1076; G06F 11/108; G06F 11/1084; G06F 11/1092; G06F 11/1096
See application file for complete search history.

(56) References Cited

U.S. PATENT DOCUMENTS

| 2004/0068612 A1* | 4/2004 | Stolowitz | G06F 11/1076 711/114 |
| --- | --- | --- | --- |
| 2004/0103246 A1 | 5/2004 | Chatterjee et al. | |
| 2009/0055682 A1 | 2/2009 | Gibson et al. | |
| 2009/0259882 A1 | 10/2009 | Shellhamer | |
| 2011/0239088 A1 | 9/2011 | Post | |
| 2014/0025990 A1* | 1/2014 | Akutsu | G06F 11/1092 714/6.22 |

FOREIGN PATENT DOCUMENTS

| CN | 1801107 A | 7/2006 |
| --- | --- | --- |
| CN | 101387975 A | 3/2009 |
| EP | 1498895 A1 | 1/2005 |

OTHER PUBLICATIONS

Foreign Communication From a Counterpart Application, PCT Application No. PCT/CN2012/085155, English Translation of International Search Report dated Aug. 22, 2013, 2 pages.

(Continued)

*Primary Examiner* — Albert Decady
*Assistant Examiner* — Christian Dorman
(74) *Attorney, Agent, or Firm* — Conley Rose, P.C.; Grant Rodolph

(57) ABSTRACT

Technologies are described herein for recovering data in a storage device comprising a controller and a plurality of storage units. The controller receives a data stream, and divides the data stream into a plurality of data blocks, obtains a code block using the plurality of data blocks. When there is one or more blocks with damaged data in the plurality of data blocks and the code block, the controller obtains a sub-block from the Mth bit to the Nth bit of each block in the plurality of data blocks and the code block as a set, and reconstructs data in one or more sub-blocks with damaged data using other sub-blocks with undamaged data in the set.

15 Claims, 8 Drawing Sheets

(56) References Cited

OTHER PUBLICATIONS

Foreign Communication From a Counterpart Application, PCT Application No. PCT/CN2012/085155, English Translation of Written Opinion dated Aug. 22, 2013, 5 pages.

Paris, J., et al., "Improving Disk Array Reliability Through Expedited Scrubbing," Fifth IEEE International Conference on Networking, Architecture, and Storage, Jul. 15, 2010, pp. 119-125.
Foreign Communication From a Counterpart Application, European Application No. 12888826.0, Extended European Search Report dated Oct. 12, 2015, 10 pages.

* cited by examiner

DATA BLOCK SUB-DIVISION BASED DATA RECOVERY METHOD AND DEVICE

CROSS-REFERENCE TO RELATED APPLICATIONS

This application is a continuation of International Application No. PCT/CN2012/085155, filed on Nov. 23, 2012, which is hereby incorporated by reference in its entirety.

TECHNICAL FIELD

The present invention relates to the field of data processing, and in particular, to a data recovery method and device.

BACKGROUND

With the development of network technologies, data that needs to be processed increases rapidly, and it is a huge challenge for a modern enterprise to provide storage with high reliability and high scalability for mass data. To ensure data reliability and availability, a method of storing multiple data copies is generally used. When a copy cannot be used because a hard disk, a server, a network, or software encounters a fault, a service is provided by another copy, which brings a problem of extremely low effective storage space usage. Taking data with 3 copies as an example, the effective storage space usage is only about 30%.

Currently, an erasure code (EC) technology is mainly used for solving the problem of low effective storage space usage. In the technology, a dataset is evenly divided into n data blocks; then m redundant code blocks of the dataset are calculated by an exclusive OR operation or an algebra operation, and the n data blocks and the m code blocks are stored in different places separately. When a bad block with damaged data exists in the n data blocks and the m code blocks, the bad block is recovered by using an undamaged data block and an undamaged code block to perform a related operation, where n and m are integers greater than 0.

However, in the foregoing technology, when the number of bad blocks is greater than m, the bad blocks cannot be recovered, resulting in low reliability of data storage.

SUMMARY

Embodiments of the present invention provide a data recovery method and device, which can improve reliability of data storage.

A first aspect of the present invention provides a data recovery method, where a currently processed dataset is divided into n data blocks, m redundant code blocks of the dataset are calculated, and n and m are integers greater than 0, where m is greater than or equal to 1; and the method may further include: when one or more bad blocks exist in the n data blocks, analyzing a position in which damaged data of each bad block in the n data blocks is located in each bad block; dividing, according to the analyzed position, each block of the n data blocks and each block of the m code blocks into h sub-blocks according to a same division rule, and in all sub-blocks included in the n data blocks and the m code blocks, using, according to the analyzed position, sub-blocks located in a same position in each data block and each code block as one sub-set, where the number of bad sub-blocks with damaged data, which are included in each sub-set, is less than or equal to m, and h is an integer greater than 1; and for one sub-set with a bad sub-block, recovering damaged data of a bad sub-block in the sub-set by using data of an undamaged sub-block belonging to the sub-set with a bad sub-block.

With reference to the first aspect, in a first possible implementation manner, the recovering damaged data of a bad sub-block in the sub-set by using data of an undamaged sub-block belonging to the sub-set with a bad sub-block includes: acquiring, from the sub-set with a bad sub-block, data of a sub-block belonging to the m code blocks and data of an undamaged sub-block belonging to the n data blocks; and recovering the damaged data of the bad sub-block in the sub-set by using the acquired data of the sub-block in the m code blocks and the acquired data of the undamaged sub-block in the n data blocks.

With reference to the first aspect, in a second possible implementation manner, for one sub-set with a bad sub-block, the recovering damaged data of a bad sub-block in the sub-set by using data of an undamaged sub-block belonging to the sub-set with a bad sub-block includes: analyzing the number of bad sub-blocks in the sub-set with a bad sub-block; acquiring, from the sub-set with a bad sub-block, data of sub-blocks that belong to the m code blocks and have a same quantity as the bad sub-blocks, and data of an undamaged sub-block belonging to the n data blocks; and recovering the damaged data of the bad sub-block in the sub-set by using the acquired data of the sub-blocks in the m code blocks and the acquired data of the undamaged sub-block in the n data blocks.

With reference to the first aspect or the first possible implementation manner or the second possible implementation manner, in a third possible implementation manner, the dividing, according to the analyzed position, each block of the n data blocks and each block of the m code blocks into h sub-blocks according to a same division rule includes: dividing, according to the analyzed position, each block of the n data blocks and each block of the m code blocks into the h sub-blocks according to a preset size specified in the same division rule, where the preset size is a size of a common multiple of a minimum unit for data storage in the n data blocks and a minimum unit for data storage in the m code blocks.

With reference to the first aspect or the first possible implementation manner or the second possible implementation manner, in a fourth possible implementation manner, the dividing, according to the analyzed position, each block of the n data blocks and each block of the m code blocks into h sub-blocks according to a same division rule includes: dividing, according to the analyzed position, each block of the n data blocks and each block of the m code blocks into the h sub-blocks according to a preset size specified in the same division rule, where the preset size takes one sector as a unit and is an integral multiple of a size of one sector.

A second aspect of the present invention provides a data recovery device, where a currently processed dataset is divided into n data blocks, m redundant code blocks of the dataset are calculated, and n and m are integers greater than 0, where m is greater than or equal to 1; and the device includes a first analyzing unit, a dividing unit, and a recovering unit, where: the first analyzing unit is configured to: when one or more bad blocks exist in the n data blocks, analyze a position in which damaged data of each bad block in the n data blocks is located in each bad block; the dividing unit is configured to: divide, according to the position analyzed by the analyzing unit, each block of the n data blocks and each block of the m code blocks into h sub-blocks according to a same division rule; and in all sub-blocks included in the n data blocks and the m code blocks, use, according to the position analyzed by the analyzing unit, sub-blocks located in a same position in each data block and each code block as one sub-set, where the number of bad sub-blocks with damaged data, which are included in each sub-set, is less than or equal to m, and h is an integer greater than 1; and the recovering unit is configured to: for one sub-set with a bad sub-block, recover damaged data of a bad sub-block in the sub-set by using data of an undamaged sub-block belonging to the sub-set with a bad sub-block.

With reference to the second aspect, in a first possible implementation manner, the recovering unit includes: a first acquiring unit, configured to acquire, from the sub-set with a bad sub-block, data of a sub-block belonging to the m code blocks and data of an undamaged sub-block belonging to the n data blocks; and a first recovering sub-unit, configured to recover the damaged data of the bad sub-block in the sub-set by using the acquired data of the sub-block in the m code blocks and the acquired data of the undamaged sub-block in the n data blocks.

With reference to the second aspect, in a second possible implementation manner, the recovering unit includes: a second analyzing unit, configured to analyze the number of bad sub-blocks in the sub-set with a bad sub-block; a second acquiring unit, configured to acquire, from the sub-set with a bad sub-block, data of sub-blocks that belong to the m code blocks and have a same quantity as the bad sub-blocks, and data of an undamaged sub-block belonging to the n data blocks; and a second recovering sub-unit, configured to recover the damaged data of the bad sub-block in the sub-set by using the acquired data of the sub-blocks in the m code blocks and the acquired data of the undamaged sub-block in the n data blocks.

With reference to the second aspect or the first possible implementation manner or the second possible implementation manner, in a third possible implementation manner, the dividing unit is further configured to divide, according to the analyzed position, each block of the n data blocks and each block of the m code blocks into the h sub-blocks according to a preset size specified in the same division rule, where the preset size is a size of a common multiple of a minimum unit for data storage in the n data blocks and a minimum unit for data storage in the m code blocks.

With reference to the second aspect or the first possible implementation manner or the second possible implementation manner, in a fourth possible implementation manner, the dividing unit is further configured to divide, according to the analyzed position, each block of the n data blocks and each block of the m code blocks into the h sub-blocks according to a preset size specified in the same division rule, where the preset size takes one sector as a unit and is an integral multiple of a size of one sector.

A third aspect of the present invention provides a data recovery device, where a currently processed dataset is divided into n data blocks, m redundant code blocks of the dataset are calculated, and n and m are integers greater than 0, where m is greater than or equal to 1; and the device includes a processor, a communication interface, a memory, and a bus, where: the processor, the communication interface, and the memory communicate with each other by using the bus; the communication interface is configured to receive data of the n data blocks and data of the m code blocks from a storage device in which the data of the n data blocks and the data of the m code blocks are stored; and the memory stores a group of program code, and the processor is configured to invoke the program code that is stored in the memory to execute the following operations: when one or more bad blocks exist in the n data blocks, analyzing a position in which damaged data of each bad block in the n data blocks is located in each bad block; dividing, according to the analyzed position, each block of the n data blocks and each block of the m code blocks into h sub-blocks according to a same division rule, and in all sub-blocks included in the n data blocks and the m code blocks, using, according to the analyzed position, sub-blocks located in a same position in each data block and each code block as one sub-set, where the number of bad sub-blocks with damaged data, which are included in each sub-set, is less than or equal to m, and h is an integer greater than 1; and for one sub-set with a bad sub-block, recovering damaged data of a bad sub-block in the sub-set by using data of an undamaged sub-block belonging to the sub-set with a bad sub-block.

With reference to the third aspect, in a first possible implementation manner, the operation, executed by the processor, of recovering damaged data of a bad sub-block in the sub-set by using data of an undamaged sub-block belonging to the sub-set with a bad sub-block includes: acquiring, from the sub-set with a bad sub-block, data of a sub-block belonging to the m code blocks and data of an undamaged sub-block belonging to the n data blocks; and recovering the damaged data of the bad sub-block in the sub-set by using the acquired data of the sub-block in the m code blocks and the acquired data of the undamaged sub-block in the n data blocks.

With reference to the third aspect, in a second possible implementation manner, the operation, executed by the processor, of recovering damaged data of the bad sub-block in the sub-set by using data of an undamaged sub-block belonging to the sub-set with a bad sub-block includes: analyzing the number of bad sub-blocks in the sub-set with a bad sub-block; acquiring, from the sub-set with a bad sub-block, data of sub-blocks that belong to the m code blocks and have a same quantity as the bad sub-blocks, and data of an undamaged sub-block belonging to the n data blocks; and recovering the damaged data of the bad sub-block in the sub-set by using the acquired data of the sub-blocks in the m code blocks and the acquired data of the undamaged sub-block in the n data blocks.

With reference to the third aspect or the first possible implementation manner or the second possible implementation manner, in a third possible implementation manner, the operation, executed by the processor, of dividing, according to the analyzed position, each block of the n data blocks and each block of the m code blocks into h sub-blocks according to a same division rule includes: dividing, according to the analyzed position, each block of the n data blocks and each block of the m code blocks into the h sub-blocks according to a preset size specified in the same division rule, where the preset size is a size of a common multiple of a minimum unit for data storage in the n data blocks and a minimum unit for data storage in the m code blocks.

With reference to the third aspect or the first possible implementation manner or the second possible implementation manner, in a fourth possible implementation manner, the operation, executed by the processor, of dividing, according to the analyzed position, each block of the n data blocks and each block of the m code blocks into h sub-blocks according to a same division rule includes: dividing, according to the analyzed position, each block of the n data blocks and each block of the m code blocks into the h sub-blocks according to a preset size specified in the same division rule, where the preset size takes one sector as a unit and is an integral multiple of a size of one sector.

A fourth aspect of the present invention provides a computer storage medium, where the computer storage medium stores a program, and the following steps are included when the program runs: the steps according to the data recovery method provided in the first aspect of the present invention.

In the foregoing technical solutions, according to the position in which the damaged data is located, each block of the n data blocks and each block of the m code blocks are divided into the h sub-blocks according to the same division rule, and in all the sub-blocks included in the n data blocks and the m code blocks, the sub-blocks located in the same position in each data block and each code block are used as one sub-set, so that the number of bad sub-blocks with the damaged data, which are included in each sub-set, is less than or equal to m, and h is an integer greater than 1. In this way, the damaged data may be grouped into sub-sets whose number is less than or equal to h, where h is greater than 1; in each sub-set, the number of sub-blocks in which the damaged data is located is less than or equal to m; then, damaged data of a bad sub-block in each sub-set is recovered by using data of an undamaged sub-block in each sub-set; therefore, at most m×h bad sub-blocks can be recovered. Compared with the prior art in which only m damaged blocks can be recovered, the present invention has an advantage that reliability of data storage can be improved.

BRIEF DESCRIPTION OF DRAWINGS

To describe the technical solutions in the embodiments of the present invention more clearly, the following briefly introduces the accompanying drawings required for describing the embodiments.

DESCRIPTION OF EMBODIMENTS

The following clearly describes the technical solutions in the embodiments of the present invention with reference to the accompanying drawings in the embodiments of the present invention.

Figure 1:
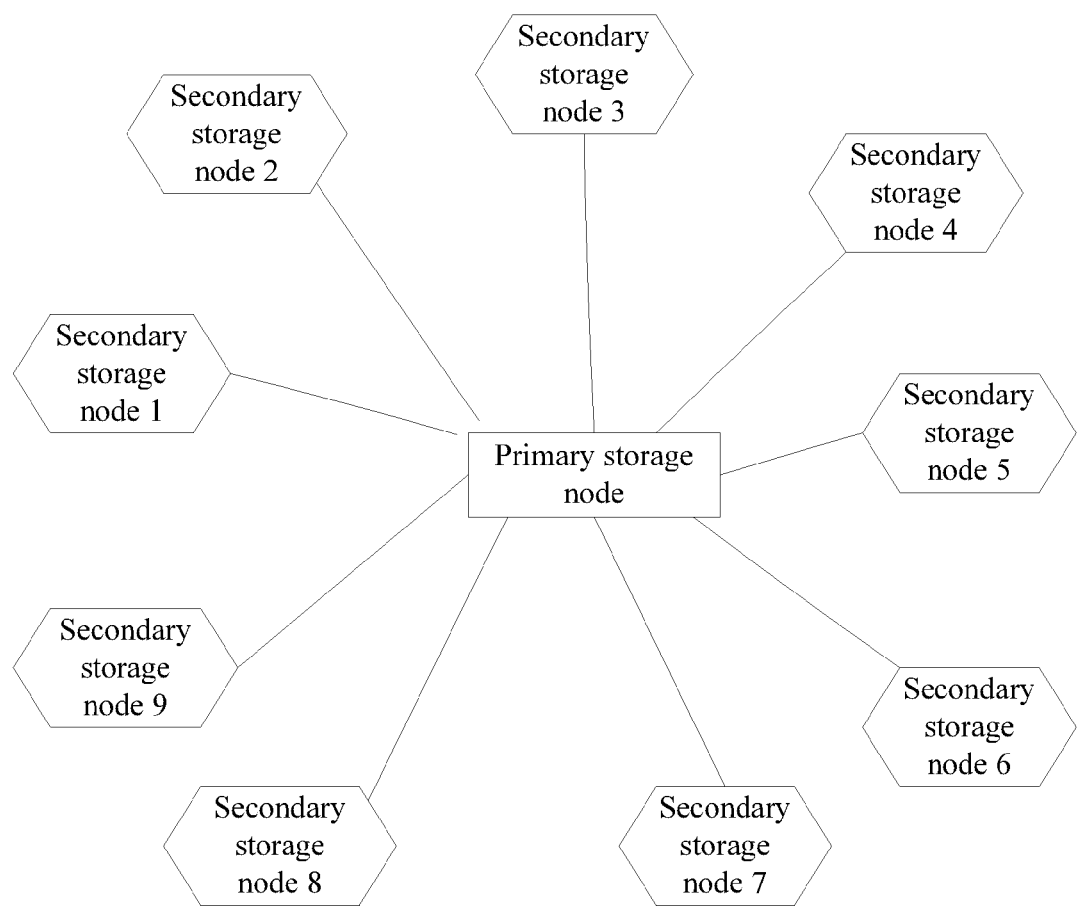
FIG. 1 is a diagram of an optional application scenario according to an embodiment of the present invention.

FIG. 1 is a diagram of an optional application scenario according to an embodiment of the present invention. When receiving a data stream A, a primary storage node divides the data stream A into n data blocks and stores the n data blocks on secondary storage nodes. Secondary storage nodes 1 to 9 shown in FIG. 1 are used to store the n data blocks and m code blocks, where n may be equal to 6, m may be equal to 9, a dataset is formed by the foregoing n data blocks, and m code blocks of the dataset may be calculated by an exclusive OR operation or an algebra operation. When a program currently executed or a service currently processed by the primary storage node shown in FIG. 1 needs to use the foregoing dataset, the foregoing n data blocks need to be acquired from the secondary storage node on which the foregoing n data blocks are stored. The foregoing primary storage node may be any one controller or storage device in a network.

Figure 2:
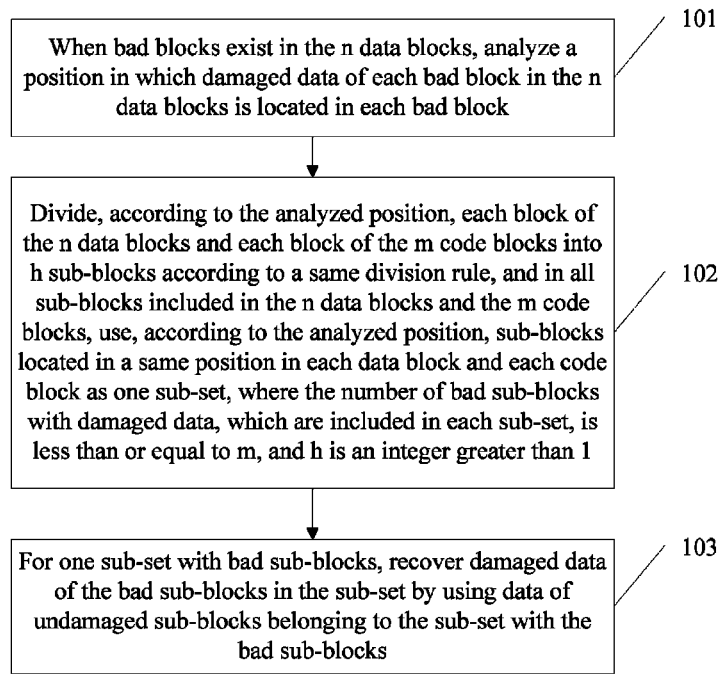
FIG. 2 is a schematic flowchart of a data recovery method according to an embodiment of the present invention.

FIG. 2 is a schematic flowchart of a data recovery method according to an embodiment of the present invention, where a currently processed dataset is divided into n data blocks, m redundant code blocks of the dataset are calculated, n is an integer greater than 1, m is an integer greater than or equal to 1; and as shown in FIG. 2, the method includes:

101. When one or more bad blocks exist in the n data blocks, analyze a position in which damaged data of each bad block in the n data blocks is located in each bad block.

Optionally, the foregoing currently processed dataset may be a dataset that is currently required for use by a device that implements the present invention, for example, a dataset that needs to be used by a program currently executed or a service currently processed by the device in the present invention.

102. Divide, according to the analyzed position, each block of the n data blocks and each block of the m code blocks into h sub-blocks according to a same division rule, and in all sub-blocks included in the n data blocks and the m code blocks, use, according to the analyzed position, sub-blocks located in a same position in each data block and each code block as one sub-set, where the number of bad sub-blocks with damaged data, which are included in each sub-set, is less than or equal to m, and h is an integer greater than 1.

It should be noted that, the foregoing position includes a starting position and an ending position of a sub-block, that is, sub-blocks located in a same position in the n data blocks and m code blocks also have a same size.

Optionally, the device (for example, a primary storage node device shown in FIG. 1) that implements the present invention stores storage address information of each block of the foregoing n data blocks and each block of the foregoing m code blocks, such as storage address information that is reported by a storage node storing each block of the foregoing n data blocks and each block of the foregoing m code blocks and is acquired in advance, or storage address information that is of each block of the foregoing n data blocks and each block of the foregoing m code blocks and acquired when the foregoing n data blocks and the foregoing m code blocks are acquired in a previous process of executing the program or processing the service. The division in step 102 may be to divide a storage address of each block of the foregoing n data blocks and each block of the foregoing m code blocks into the h sub-blocks.

The foregoing division rule may include rules, such as a size of a sub-block that is obtained by division for each data block and each code block.

Optionally, the foregoing division rule may be generated based on the foregoing analyzed position, for example: it is obtained by analysis that the position of the damaged data of the bad block in the n data blocks is at an upper part of the bad block, so that the foregoing division rule may be a division rule that each block is divided into two parts: an upper part and a lower part.

Optionally, in step 102, each block is divided into the h sub-blocks, where if each block is divided into two sub-blocks according to a middle position, positions in which the two sub-blocks included in each block are located are the upper part and the lower part of a data block or a code block; in step 102, in all the sub-blocks included in the n data blocks and the m code blocks, the sub-blocks located in the same position in each data block and each code block are used as one sub-set, that is, h sub-sets are obtained, where if each block is divided into two sub-blocks according to a middle position, two sub-sets are obtained: sub-blocks which are located in the upper part of a data block or a code block are one sub-set, and sub-blocks which are located in the lower part of the data block or the code block are the other sub-set. Therefore, in step 102, the n data blocks and the m code blocks may be divided into h sub-sets, each sub-set includes n+m sub-blocks, and sub-blocks in each sub-set are located in a same position in the data blocks or the code blocks.

103. For one sub-set with a bad sub-block, recover damaged data of a bad sub-block in the sub-set by using data of an undamaged sub-block belonging to the sub-set with a bad sub-block.

Optionally, the foregoing m code blocks of the data that are calculated may be m redundant code blocks of the data that are calculated by an exclusive OR operation or an algebra operation in the EC technology mentioned in BACKGROUND.

Figure 3:
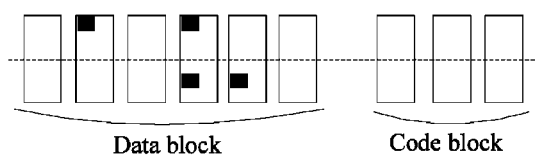
FIG. 3 is a schematic diagram of an optional data structure according to an embodiment of the present invention.

Optionally, the n data blocks and the m code blocks are shown in FIG. 3, where n is 6, and m is 3. Black boxes marked in FIG. 3 indicate positions of the damaged data, from which it can be seen that the number of bad blocks is greater than 3, so the damaged data cannot be recovered by using the prior art. In the present invention, the positions of the damaged data may be obtained by analysis in step 101; in step 102, according to the positions obtained by analysis in step 101, each block of the 6 data blocks and each block of the 3 code blocks may be divided into two sub-blocks, and specifically as shown by a dotted line in FIG. 3, each block is divided into two sub-blocks: an upper sub-block and a lower sub-block; in step 102, in all sub-blocks included in the n data blocks and the m code blocks, sub-blocks located in a same position in each data block and each code block are used as one sub-set so that two sub-sets are obtained, with one sub-set including n+m upper sub-blocks and the other sub-set including n+m lower sub-blocks, and therefore it may be obtained that there are two bad sub-blocks included in the sub-set of upper sub-blocks and there are two bad sub-blocks included in the sub-set of lower sub-blocks; finally, the damaged data of the bad sub-blocks included in the sub-set of the upper sub-blocks and the damaged data of the bad sub-blocks included in the sub-set of the lower sub-blocks may be recovered separately by performing step 103. The damaged data of 4 bad blocks can be recovered by using the foregoing technology, but cannot be recovered in the prior art, so that the foregoing technology improves reliability of data storage.

Certainly, in the present invention, h may vary with a damage condition of the data. For example, when there is more damaged data in FIG. 3, in step 102, each block in FIG. 3 may be divided into 3, 4, or 5 sub-blocks. A user may determine a size of the sub-blocks in a sub-set according to an actual size of the damaged data, so that more damaged data can be recovered. Certainly, in step 102, when each block is divided into the h sub-blocks, each sub-block may be obtained by dividing a block according to a preset size, that is, in step 102, the dividing, according to the analyzed position, each block of the n data blocks and each block of the m code blocks into h sub-blocks according to a same division rule may include: dividing, according to the analyzed position, each block in the n data blocks and each block in the m code blocks into the h sub-blocks according to a preset size specified in the same division rule.

Optionally, the preset size may be a size of a common multiple of a minimum unit for data storage in the n data blocks and a minimum unit for data storage in the m code blocks. Certainly, that each block of the n data blocks and each block of the m code blocks are divided into the h sub-blocks according to the size of the common multiple must meet the foregoing condition that in all the sub-blocks included in the n data blocks and the m code blocks, the sub-blocks located in the same position in each data block and each code block are used as one sub-set, where the number of bad sub-blocks with the damaged data, which are included in each sub-set, is less than or equal to m. For example, the size of the foregoing common multiple takes a minimum common multiple of the minimum unit for data storage in the n data blocks and the minimum unit for data storage in the m code blocks as a unit, and includes a size of at least one minimum common multiple, where the foregoing minimum unit may be storage space that is required for storing one piece of data (for example, one binary number: 0 or 1) and ensures that the data can be normally used. An algebraic operation may be used during a process of data recovery in the present invention, so that each data has an intact coding function or check function as long as one piece of data is not split in the present invention. For example, if a minimum unit for data storage in a data block is 4 bytes and a minimum unit for data storage in a code block is 3 bytes, the foregoing minimum common multiple is 12 bytes. In this way, in step 102, 12 bytes are taken as a unit, and finally the size of the sub-blocks may be a size of 24 bytes, or a size of 12 bytes, so that all undamaged data stored in each sub-block is intact, that is, in step 102, data stored in a data block or a code block is not damaged during a dividing process, so as to ensure a function, such as a coding or check function, of code data (for example, a check code) stored in a code block is not invalid.

Optionally, the preset size takes one sector as a unit and is an integral multiple of a size of one sector, in other words, a size of one sub-block is N sectors, where N is a positive integer greater than or equal to 1, for example, the size of one sub-block includes sizes of two or three sectors.

In the foregoing technical solutions, according to the position in which the damaged data is located, each block of the n data blocks and each block of the m code blocks are divided into the h sub-blocks according to the same division rule, and in all the sub-blocks included in the n data blocks and the m code blocks, the sub-blocks located in the same position in each data block and each code block are used as one sub-set, so that the number of bad sub-blocks with the damaged data, which are included in each sub-set, is less than or equal to m, and h is an integer greater than 1. In this way, the damaged data may be grouped into sub-sets whose number is less than or equal to h, and in each sub-set, the number of sub-blocks in which the damaged data is located is less than or equal to m; then, damaged data of a bad sub-block in each sub-set is recovered by using data of an undamaged sub-block in each sub-set; therefore, at most m×h bad sub-blocks can be recovered. Compared with the prior art in which only m damaged blocks can be recovered, the present invention has an advantage that reliability of data storage can be improved.

Figure 4:
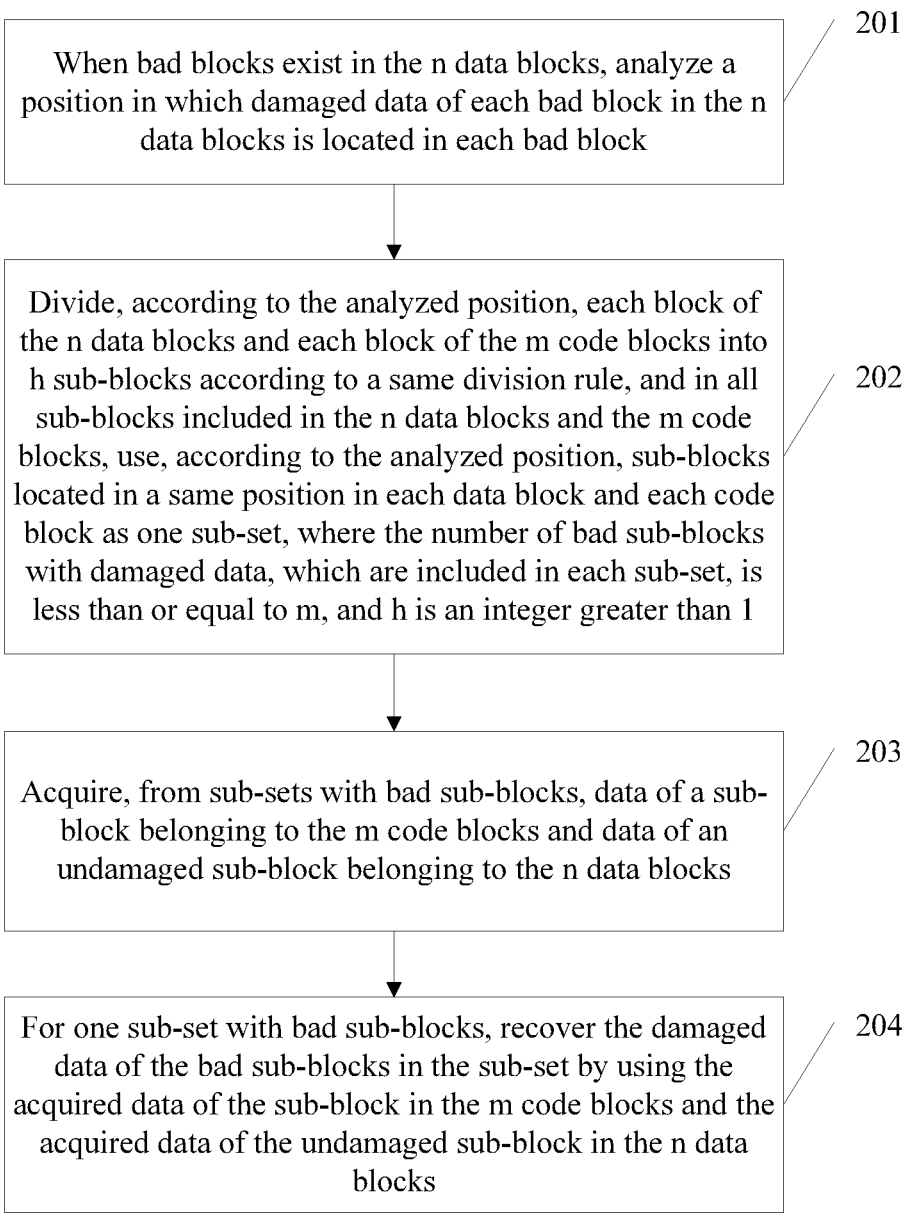
FIG. 4 is a schematic flowchart of another data recovery method according to an embodiment of the present invention.

FIG. 4 is a schematic flowchart of a data recovery method according to an embodiment of the present invention, where a currently processed dataset is divided into n data blocks, m redundant code blocks of the dataset are calculated, and n is an integer greater than 1, m is an integer greater than or equal to 1; and as shown in FIG. 4, the method includes:

201. When one or more bad blocks exist in the n data blocks, analyze a position in which damaged data of each bad block in the n data blocks is located in each bad block.

In an actual application, it is almost impossible that damaged data is a whole block, for example, for a data block whose size is 1M, damaged data may concentrate in a sector.

As shown in FIG. 3, the damaged data occupies only a very small part of a whole data block. In this way, the position of the damaged data can be obtained by analysis in step 201.

202. Divide, according to the analyzed position, each block of the n data blocks and each block of the m code blocks into h sub-blocks according to a same division rule, and in all sub-blocks included in the n data blocks and the m code blocks, use, according to the analyzed position, sub-blocks located in a same position in each data block and each code block as one sub-set, where the number of bad sub-blocks with damaged data, which are included in each sub-set, is less than or equal to m, and h is an integer greater than 1.

Optionally, as shown in FIG. 3, there are 4 pieces of damaged data that are located in 4 blocks, where 2 pieces are located in an upper part, and the other 2 pieces are located in a lower part. Therefore, in step 202, each block in FIG. 3 may be divided into two sub-blocks: an upper sub-block and a lower sub-block.

203. Acquire, from a sub-set with a bad sub-block, data of a sub-block belonging to the m code blocks and data of an undamaged sub-block belonging to the n data blocks.

Optionally, the foregoing step 203 may be that a device (for example, a primary storage node shown in FIG. 1) that implements the present invention acquires the foregoing data of the sub-block belonging the m code blocks and the foregoing data of the undamaged sub-block belonging to the n data blocks from a device that stores the foregoing n data blocks and the foregoing m code blocks.

204. For one sub-set with a bad sub-block, recover the damaged data of the bad sub-block in the sub-set by using the acquired data of the sub-block in the m code blocks and the acquired data of the undamaged sub-block in the n data blocks.

Optionally, as shown in FIG. 3, each data block and each code block are divided into two sub-blocks: an upper sub-block and a lower sub-block, so that two sub-sets are formed. When damaged data exists only in an upper sub-block in FIG. 3, only a sub-block in a sub-set to which a bad block belongs is acquired in step 203. Compared with the prior art in which network transmission is performed by taking a whole data block or a whole code block as a unit, the present invention has an advantage that network traffic can be reduced to save a network resource.

Optionally, step 203 may include: for a sub-set with a bad sub-block, position information of an undamaged sub-block in the sub-set with a bad sub-block is sent to a storage device (for example, a secondary storage node shown in FIG. 1) on which data of the undamaged sub-block is stored, and a request for returning data included in the undamaged sub-block in the sub-set with a bad sub-block is sent to the storage device; and the data returned by the storage device is received.

In this way, only data included in a sub-block in the sub-set with a bad sub-block can be transmitted between the device (for example, the primary storage node shown in FIG. 1) that implements the present invention and another storage device (for example, the secondary storage node shown in FIG. 1) on which the data is stored, thereby reducing network traffic.

As an optional implementation manner, step 204 may include: the damaged data of the bad sub-block in the sub-set is recovered by using the acquired data of the sub-block in the m code blocks and the acquired data of the undamaged sub-block in the n data blocks and by using an EC algorithm.

Optionally, for example, a bad sub-block in each sub-set is recovered by using an exclusive OR operation or an algebra operation.

As an optional implementation manner, when it is discovered that, in the sub-set with a bad sub-block, a bad block with damaged data exists in sub-blocks belonging to the m code blocks in a sub-set, and the number of bad sub-blocks in the m code blocks plus the number of bad sub-blocks in the n data blocks is greater than m, the sub-set may be re-processed according to the foregoing division manner. Each sub-block in the sub-set with a bad sub-block may be divided into multiple smaller sub-blocks, so as to meet the requirement that the number of bad sub-blocks with the damaged data, which are included in the foregoing sub-set, is less than or equal to m. Then, a recovery is performed by using technology of step 204. For example, sub-sets with a bad sub-block include a sub-set 1, a sub-set 2 and a sub-set 3. When bad blocks with damaged data exist in the sub-blocks belonging to the m code blocks in the sub-set 3, and when the number of bad blocks with the damaged data that exist in the sub-blocks of the m code blocks is h, the number of bad sub-blocks belonging to the n data blocks in the sub-set 3 is t; when h+t is greater than m, the sub-set 3 may be re-processed according to the foregoing division manner, and each sub-block in the sub-set with a bad sub-block is divided into multiple smaller sub-blocks, so as to meet the requirement that the number of bad smaller sub-blocks with the damaged data, which are included in the foregoing sub-set, is less than or equal to m. Then, the recovery is performed by using the technical features of step 204.

As an optional implementation manner, the present invention may be applied to an Reed Solomon (RS) algorithm, a Cauchy Reed Solomon (CRS) algorithm that is an improved RS algorithm, a Redundant Arrays of Inexpensive Disks (RAID) 5 technology, and a RAID6 technology.

In the foregoing technical solutions, on a basis of the foregoing embodiment, it is implemented that network transmission is performed in a unit of sub-block, thereby saving a network resource and improving reliability of data storage.

Figure 5:
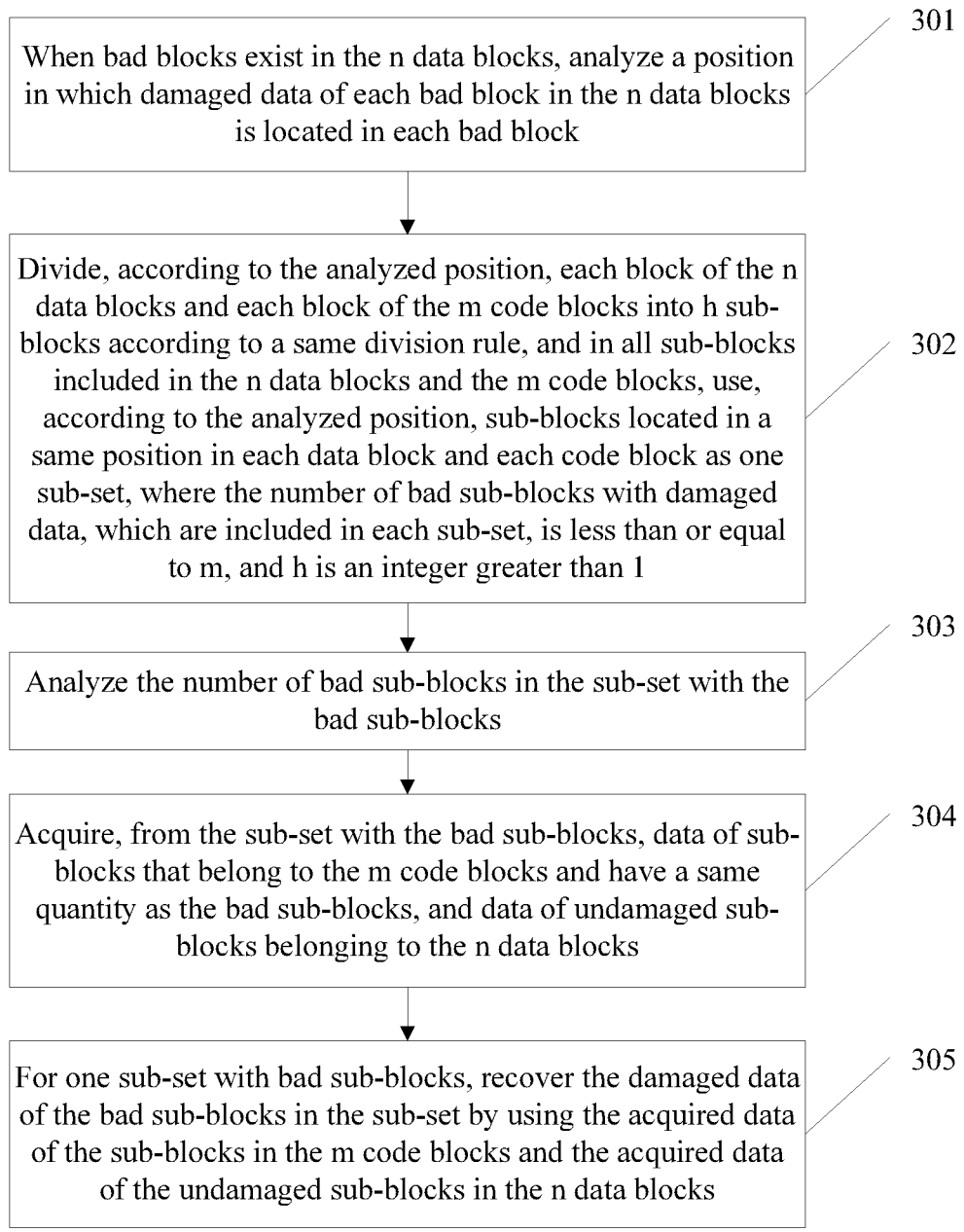
FIG. 5 is a schematic flowchart of another data recovery method according to an embodiment of the present invention.

FIG. 5 is a schematic flowchart of a data recovery method according to an embodiment of the present invention, where a currently processed dataset is divided into n data blocks, m redundant code blocks of the dataset are calculated, and n is an integer greater than 1, m is an integer greater than or equal to 1; and as shown in FIG. 5, the method includes:

301. When one or more bad blocks exist in the n data blocks, analyze a position in which damaged data of each bad block in the n data blocks is located in each bad block.

302. Divide, according to the analyzed position, each block of the n data blocks and each block of the m code blocks into h sub-blocks according to a same division rule, and in all sub-blocks included in the n data blocks and the m code blocks, use, according to the analyzed position, sub-blocks located in a same position in each data block and each code block as one sub-set, where the number of bad sub-blocks with damaged data, which are included in each sub-set, is less than or equal to m, and h is an integer greater than 1.

303. Analyze the number of bad sub-blocks in the sub-set with a bad sub-block.

304. Acquire, from the sub-set with a bad sub-block, data of sub-blocks that belong to the m code blocks and have a same quantity as the bad sub-blocks, and data of an undamaged sub-block belonging to the n data blocks.

305. For one sub-set with a bad sub-block, recover the damaged data of the bad sub-block in the sub-set by using the acquired data of the sub-blocks in the m code blocks and the acquired data of the undamaged sub-block in the n data blocks.

In this way, it can be implemented that, data of only the sub-blocks that belong to the m code blocks and have the same quantity as the bad sub-blocks is acquired, so that network overheads can be reduced.

In the foregoing technical solutions, on a basis of the foregoing embodiment, it is implemented that data of only the sub-blocks that belong to the m code blocks and have the same quantity as the bad sub-blocks is acquired, so that network overheads can be reduced and reliability of data storage can also be improved.

The following describes device embodiments of the present invention. The device embodiments of the present invention are used for executing the methods discripted in the method embodiments 1 to 3 of the present invention. For convenience of description, only related parts of the embodiments of the present invention are disclosed, and for specific technical details which are not disclosed, reference is made to embodiment 1, embodiment 2, and embodiment 3 of the present invention.

Figure 6:
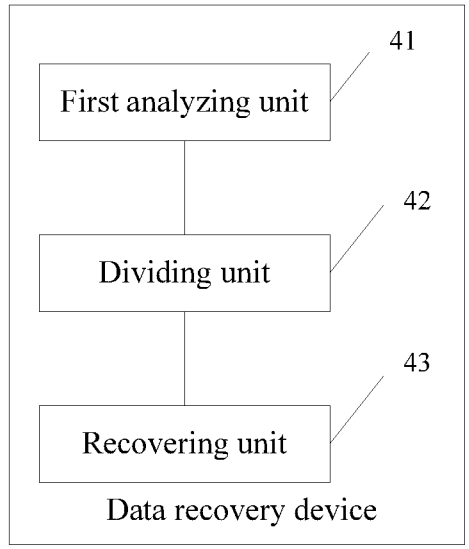
FIG. 6 is a schematic structural diagram of a data recovery device according to an embodiment of the present invention.

FIG. 6 is a schematic structural diagram of a data recovery device according to an embodiment of the present invention, where a currently processed dataset is divided into n data blocks, m redundant code blocks of the dataset are calculated, and n is an integer greater than 1, m is an integer greater than or equal to 1. As shown in FIG. 6, the device includes: a first analyzing unit 41, a dividing unit 42, and a recovering unit 43, where: the first analyzing unit 41 is configured to: when one or more bad blocks exist in the n data blocks, analyze a position in which damaged data of each bad block in the n data blocks is located in each bad block; the dividing unit 42 is configured to: divide, according to the position analyzed by the analyzing unit 41, each block of the n data blocks and each block of the m code blocks into h sub-blocks according to a same division rule, and in all sub-blocks included in the n data blocks and the m code blocks, use, according to the position analyzed by the analyzing unit 41, sub-blocks located in a same position in each data block and each code block as one sub-set, where the number of bad sub-blocks with damaged data, which are included in each sub-set, is less than or equal to m, and h is an integer greater than 1; and the recovering unit 43 is configured to: for one sub-set with a bad sub-block, recover damaged data of a bad sub-block in the sub-set by using data of an undamaged sub-block belonging to the sub-set with a bad sub-block.

As an optional implementation manner, the dividing unit 42 is further configured to divide, according to the analyzed position, each block of the n data blocks and each block of the m code blocks into the h sub-blocks according to a preset size specified in the same division rule.

Optionally, the preset size is a size of a common multiple of a minimum unit for data storage in the n data blocks and a minimum unit for data storage in the m code blocks.

Optionally, the preset size takes one sector as a unit and is an integral multiple of a size of one sector.

Therefore, in the dividing unit 42, it can be implemented that all undamaged data stored in each sub-block is intact in the foregoing division manner. That is, the dividing unit 42 does not damage data stored in a data block or a code block during a dividing process; therefore, it is ensured that a function, such as a coding or check function, of code data (for example, a check code) stored in a code block is not invalid.

In the foregoing technical solutions, according to the position in which the damaged data is located, each block of the n data blocks and each block of the m code blocks are divided into the h sub-blocks according to the same division rule, and in all the sub-blocks included in the n data blocks and the m code blocks, the sub-blocks located in the same position in each data block and each code block are used as one sub-set, so that the number of bad sub-blocks with the damaged data, which are included in each sub-set, is less than or equal to m, and h is an integer greater than 1. In this way, the damaged data may be grouped into sub-sets whose number is less than or equal to h, and in each sub-set, the number of sub-blocks in which the damaged data is located is less than or equal to m; then, damaged data of a bad sub-block in each sub-set is recovered by using data of an undamaged sub-block in each sub-set; therefore, at most m×h bad sub-blocks can be recovered. Compared with the prior art in which only m damaged blocks can be recovered, the present invention has an advantage that reliability of data storage can be improved.

Figure 7:
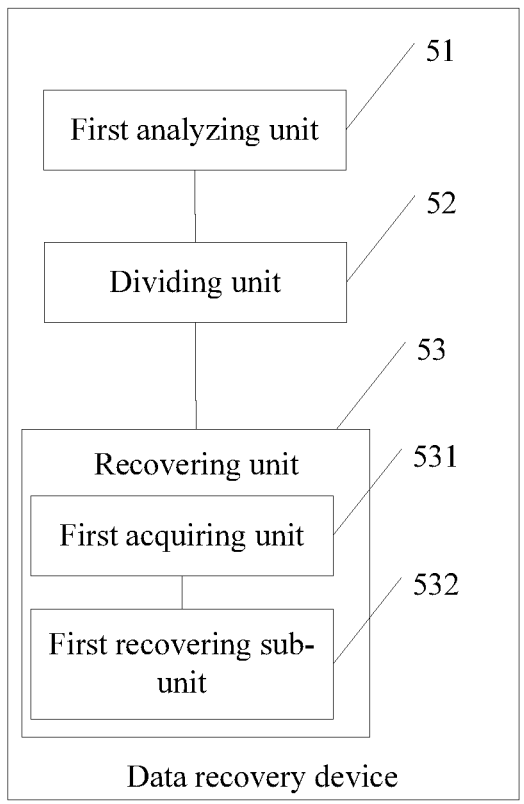
FIG. 7 is a schematic structural diagram of another data recovery device according to an embodiment of the present invention.

FIG. 7 is a schematic structural diagram of another data recovery device according to an embodiment of the present invention, where a currently processed dataset is divided into n data blocks, m redundant code blocks of the dataset are calculated, and n is and integer greater than 1, m is an integer greater than or equal to 1. As shown in FIG. 7, the device includes: a first analyzing unit 51, a dividing unit 52 and a recovering unit 53, where the recovering unit 53 includes a first acquiring unit 531 and a first recovering sub-unit 532.

The first analyzing unit 51 is configured to: when one or more bad blocks exist in the n data blocks, analyze a position in which damaged data of each bad block in the n data blocks is located in each bad block.

The dividing unit 52 is configured to: divide, according to the analyzed position, each block of the n data blocks and each block of the m code blocks into h sub-blocks according to a same division rule; and in all sub-blocks included in the n data blocks and the m code blocks, use, according to the analyzed position, sub-blocks located in a same position in each data block and each code block as one sub-set, where the number of bad sub-blocks with damaged data, which are included in each sub-set, is less than or equal to m, and h is an integer greater than 1.

The first acquiring unit 531 is configured to acquire, from the sub-set with a bad sub-block, data of a sub-block belonging to the m code blocks and data of an undamaged sub-block belonging to the n data blocks.

The first recovering sub-unit 532 is configured to: for one sub-set with a bad sub-block, recover the damaged data of the bad sub-block in the sub-set by using the acquired data of the sub-block in the m code blocks and the acquired data of the undamaged sub-block in the n data blocks.

Optionally, as shown in FIG. 3, each data block and each code block are divided into two sub-blocks: an upper sub-block and a lower sub-block, so that two sub-sets are formed. Therefore, the first acquiring unit 531 may be used for network transmission of a data block or a code block by taking each sub-block in the sub-sets as a unit. When damaged data exists only in an upper sub-block in FIG. 3, in the first acquiring unit 531, only a sub-block in a sub-set to which a bad block belongs is acquired. Compared with the prior art in which network transmission is performed by taking a whole data block or a whole code block as a unit, the present invention has an advantage that network traffic can be reduced to save a network resource.

As an optional implementation manner, the first recovering sub-unit 532 may be further configured to: for one sub-set with a bad sub-block, recover the damaged data of the bad sub-block in the sub-set by using the acquired data in the m code blocks and the acquired undamaged data in the n data blocks and by using an EC algorithm.

Optionally, for example, a damaged sub-block in each sub-set is recovered by using an exclusive OR operation or an algebra operation.

Figure 8:
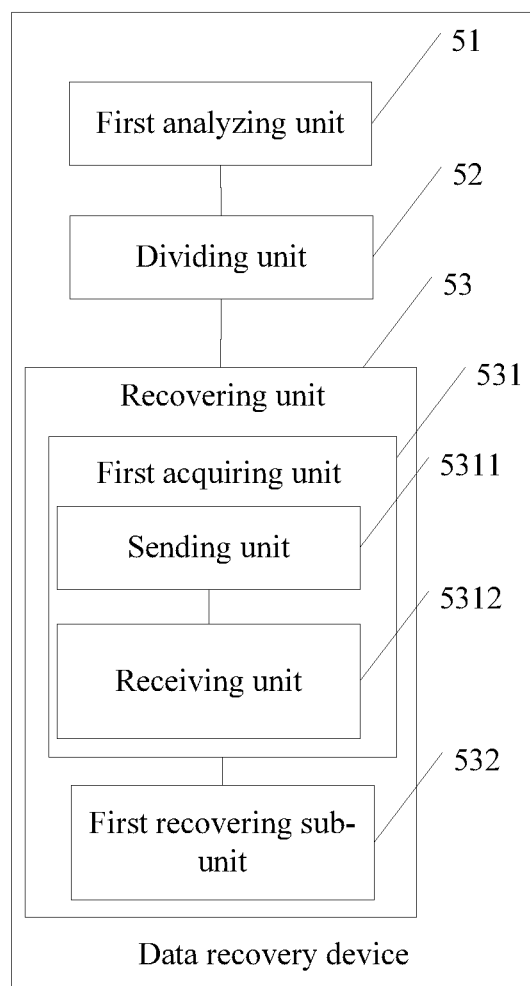
FIG. 8 is a schematic structural diagram of a data recovery device according to an embodiment of the present invention.

As an optional implementation manner, as shown in FIG. 8, the first acquiring unit 531 may further include: a sending unit 5311, configured to: for the sub-set with a bad sub-block, send position information of an undamaged sub-block in the sub-set with a bad sub-block to a storage device (for example, a secondary storage node shown in FIG. 1) on which data of the undamaged sub-block is stored, and send a request for returning data included in the undamaged sub-block in the sub-set with a bad sub-block to the storage device; and a receiving unit 5312, configured to receive the data returned by the storage device.

In this way, only data included in a sub-block in the sub-set with a bad sub-block can be transmitted between a device (for example, a primary storage node shown in FIG. 1) that implements the present invention and the foregoing storage device (for example, the secondary storage node shown in FIG. 1), thereby reducing network traffic.

Figure 9:
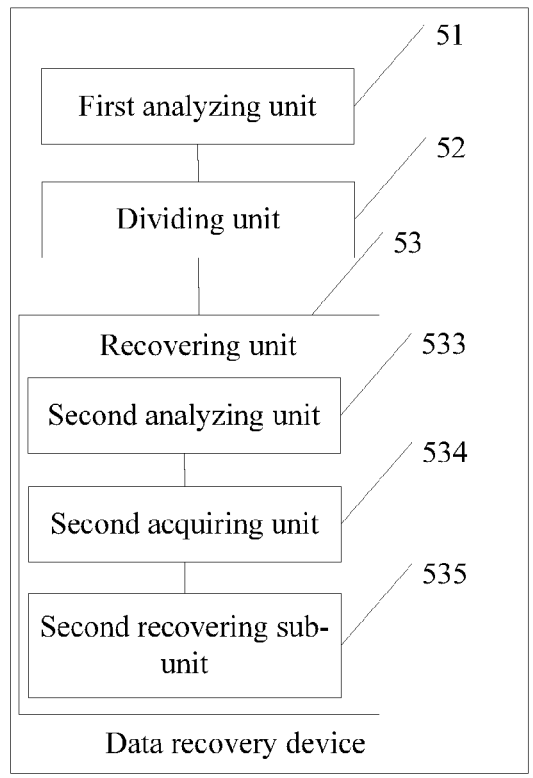
FIG. 9 is a schematic structural diagram of another data recovery device according to an embodiment of the present invention.

As an optional implementation manner, as shown in FIG. 9, the recovering unit 53 may further include: a second analyzing unit 533, configured to analyze the number of bad sub-blocks in the sub-set with a bad sub-block; a second acquiring unit 534, configured to acquire, from the sub-set with a bad sub-block, data of sub-blocks that belong to the m code blocks and have a same quantity as the bad sub-blocks, and data of an undamaged sub-block belonging to the n data blocks; and a second recovering sub-unit 535, configured to: for one sub-set with a bad sub-block, recover the damaged data of the bad sub-block in the sub-set by using the acquired data of the sub-blocks in the m code blocks and the acquired data of the undamaged sub-block in the n data blocks.

In this way, it can be implemented that data of only the sub-blocks that belong to the m code blocks and have the same quantity as the bad sub-blocks is acquired, so that network overheads can be reduced.

As an optional implementation manner, the present invention may be applied to the RS algorithm, the CRS algorithm, the RAID5 technology, and the RAID6 technology.

In the foregoing technical solutions, on a basis of the foregoing embodiment, it is implemented that network transmission is performed in a unit of sub-block, thereby saving a network resource and improving reliability of data storage.

Figure 10:
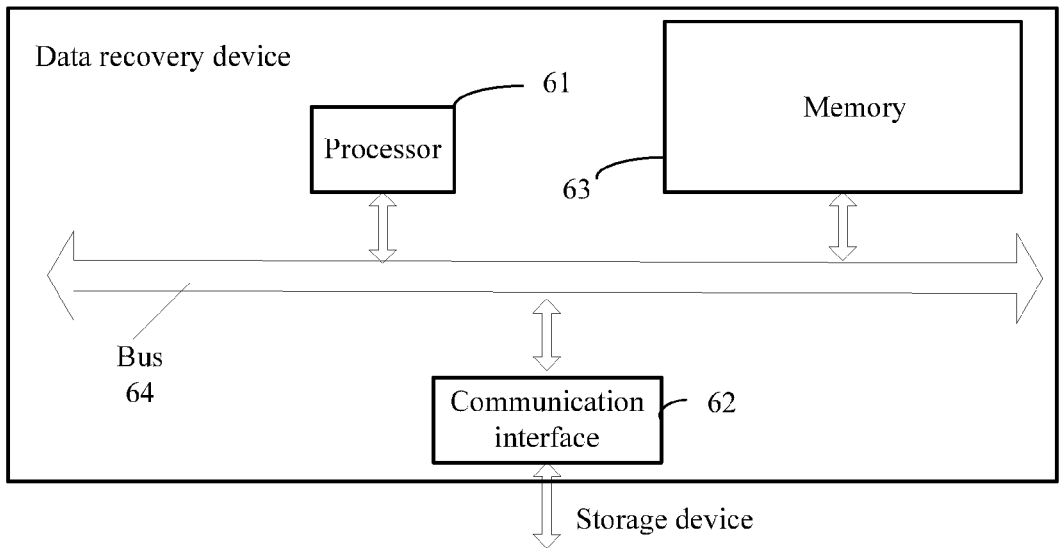
FIG. 10 is a schematic structural diagram of a data recovery device according to an embodiment of the present invention.

FIG. 10 is a schematic structural diagram of another data recovery device according to an embodiment of the present invention, where a currently processed dataset is divided into n data blocks, m redundant code blocks of the dataset are calculated, and n is an integer greater than 1, m is an integer greater than or equal to 1; as shown in FIG. 10, the device includes a processor 61, a communication interface 62, a memory 63, and a bus 64, where: the processor 61, the communication interface 62, and the memory 63 communicate with each other by using the bus 64; the communication interface 62 is configured to receive data of the n data blocks and data of the m code blocks from a storage device in which the data of the n data blocks and the data of the m code blocks are stored; and the memory 63 stores a group of program code, and the processor 61 is configured to invoke the program code that is stored in the memory 63 to execute the following operations: when one or more bad blocks exist in the n data blocks, analyzing a position in which damaged data of each bad block in the n data blocks is located in each bad block; dividing, according to the analyzed position, each block of the n data blocks and each block of the m code blocks into h sub-blocks according to a same division rule, and in all sub-blocks included in the n data blocks and the m code blocks, using, according to the analyzed position, sub-blocks located in a same position in each data block and each code block as one sub-set, where the number of bad sub-blocks with damaged data, which are included in each sub-set, is less than or equal to m, and h is an integer greater than 1; and for one sub-set with a bad sub-block, recovering damaged data of a bad sub-block in the sub-set by using data of an undamaged sub-block belonging to the sub-set with a bad sub-block.

Optionally, the foregoing m redundant code blocks of the data that are calculated are specifically m code blocks of the data that are calculated by an exclusive OR operation or an algebra operation in the EC technology mentioned in BACKGROUND.

As an optional implementation manner, the operation, executed by the processor 61, of dividing, according to the analyzed position, each block of the n data blocks and each block of the m code blocks into h sub-blocks according to a same division rule may include: dividing, according to the analyzed position, each block of the n data blocks and each block of the m code blocks the h sub-blocks according to a preset size specified in the same division rule.

Optionally, the preset size is a size of a common multiple of a minimum unit for data storage in the n data blocks and a minimum unit for data storage in the m code blocks.

Optionally, the preset size takes one sector as a unit and is an integral multiple of a size of one sector.

In this way, the processor 61 can implement that all undamaged data stored in each sub-block is intact. That is, the processor 61 does not damage data stored in a data block or a code block during a dividing process; therefore, it is ensured that a function, such as a coding or check function, of code data (for example, a check code) stored in a code block is not invalid.

In the foregoing technical solutions, according to the position in which the damaged data is located, each block of the n data blocks and each block of the m code blocks are divided into the h sub-blocks according to the same division rule, and in all the sub-blocks included in the n data blocks and the m code blocks, the sub-blocks located in the same position in each data block and each code block are used as one sub-set, so that the number of bad sub-blocks with the damaged data, which are included in each sub-set, is less than or equal to m, and h is an integer greater than 1. In this way, the damaged data may be grouped into sub-sets whose number is less than or equal to h, and in each sub-set, the number of sub-blocks in which the damaged data is located is less than or equal to m; then, damaged data of a bad sub-block in each sub-set is recovered by using data of an undamaged sub-block in each sub-set; therefore, at most m×h bad sub-blocks can be recovered. Compared with the prior art in which only m damaged blocks can be recovered, the present invention has an advantage that reliability of data storage can be improved.

Figure 11:
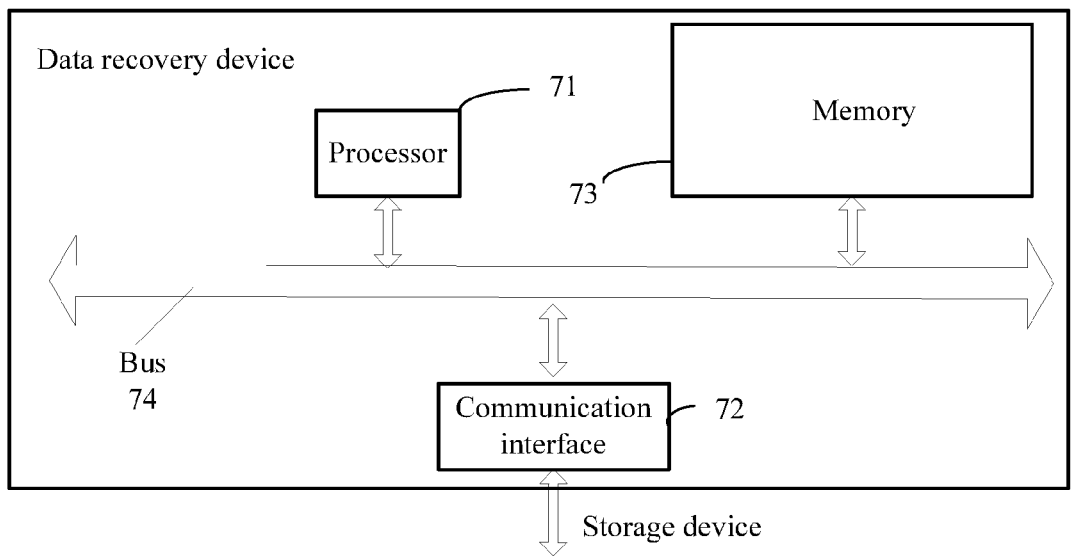
FIG. 11 is a schematic structural diagram of another data recovery device according to an embodiment of the present invention.

FIG. 11 is a schematic structural diagram of another data recovery device according to an embodiment of the present invention, where a currently processed dataset is divided into n data blocks, m redundant code blocks of the dataset are calculated, and n is an integer greater than 1, m is an integer greater than or equal to 1; as shown in FIG. 11, the device includes a processor 71, a communication interface 72, a memory 73, and a bus 74, where: the processor 71, the communication interface 72, and the memory 73 communicate with each other by using the bus 74; the communication interface 72 is configured to receive data of the n data blocks and data of the m code blocks from a storage device in which the data of the n data blocks and the data of the m code blocks are stored; and the memory 73 stores a group of program code, and the processor 71 is configured to invoke the program code that is stored in the memory 73 to execute the following operations: when one or more bad blocks exist in the n data blocks, analyzing a position in which damaged data of each bad block in the n data blocks is located in each bad block; dividing, according to the analyzed position, each block of the n data blocks and each block of the m code blocks into h sub-blocks according to a same division rule, and in all sub-blocks included in the n data blocks and the m code blocks, using, according to the analyzed position, sub-blocks located in a same position in each data block and each code block as one sub-set, where the number of bad sub-blocks with damaged data, which are included in each sub-set, is less than or equal to m, and h is an integer greater than 1; acquiring, from the sub-set with a bad sub-block, data of a sub-block belonging to the m code blocks and data of an undamaged sub-block belonging to the n data blocks; and for one sub-set with a bad sub-block, recovering the damaged data of the bad sub-block in the sub-set by using the acquired data of the sub-block in the m code blocks and the acquired data of the undamaged sub-block in the n data blocks.

It should be noted that, the communication interface 72 may be configured to receive information sent to a device (for example, a primary storage node shown in FIG. 1) that implements the embodiment from another device (for example, a secondary storage node shown in FIG. 1), and transmit the received information to the processor 71. For example, the communication interface 72 is configured to acquire, from the sub-set with a bad sub-block, data of a sub-block belonging to the m code blocks and data of an undamaged sub-block belonging to the n data blocks.

As an optional implementation manner, the step, executed by the processor 71, of receiving data information that is sent by the storage device and included in an undamaged sub-block in the sub-set with a bad sub-block may include: for the sub-set with a bad sub-block, position information of the undamaged sub-block in the sub-set with a bad sub-block is sent to a storage device (for example, a secondary storage node shown in FIG. 1) on which data of the undamaged sub-block is stored, and a request for returning the data included in the undamaged sub-block in the sub-set with a bad sub-block is sent to the storage device; and the data returned by the storage device is received.

The processor 71 may send, through the communication interface 72, the position information of the undamaged sub-block in the sub-set with a bad sub-block to the storage device (for example, the secondary storage node shown in FIG. 1) on which the data of the undamaged sub-block is stored, and send the request for returning the data included in the undamaged sub-block in the sub-set with a bad sub-block to the storage device; the processor 71 may receive the data returned by the storage device through the communication interface 72.

In this way, only data included in a sub-block in the sub-set with a bad sub-block can be transmitted between the device (for example, the primary storage node shown in FIG. 1) that implements the present invention and the foregoing storage device (for example, the secondary storage node shown in FIG. 1), thereby reducing network traffic.

As an optional implementation manner, the step, executed by the processor 71, of recovering the damaged data of the bad sub-block in the sub-set by using the acquired data of the sub-block in the m code blocks and the acquired data of the undamaged sub-block in the n data blocks may include: the damaged data of the bad sub-block in the sub-set is recovered by using the acquired data of the sub-block in the m code blocks and the acquired data of the undamaged sub-block in the n data blocks and by using an EC algorithm.

Optionally, for example, a damaged sub-block in each sub-set is recovered by using an exclusive OR operation or an algebra operation.

As an optional implementation manner, the processor 71 is configured to invoke the program code that is stored in the memory 73, and may be further configured to execute the following operations: when one or more bad blocks exist in the n data blocks, analyzing a position in which damaged data of each bad block in the n data blocks is located in each bad block; dividing, according to the analyzed position, each block of the n data blocks and each block of the m code blocks into h sub-blocks according to a same division rule, and in all sub-blocks included in the n data blocks and the m code blocks, using, according to the analyzed position, sub-blocks located in a same position in each data block and each code block as one sub-set, where the number of bad sub-blocks with damaged data, which are included in each sub-set, is less than or equal to m, and h is an integer greater than 1; analyzing the number of bad sub-blocks in the sub-set with a bad sub-block; acquiring, from the sub-set with a bad sub-block, data of sub-blocks that belong to the m code blocks and have a same quantity as the bad sub-blocks, and data of an undamaged sub-block belonging to the n data blocks; and for one sub-set with a bad sub-block, recovering the damaged data of the bad sub-block in the sub-set by using the acquired data of the sub-blocks in the m code blocks and the acquired data of the undamaged sub-block in the n data blocks.

The communication interface 72 may further be configured to receive the data of the n data blocks from the storage device on which the data of the n data blocks is stored, and receive the data of the sub-blocks that belong to the m code blocks and have the same quantity as the bad sub-blocks from the storage device on which the data of the m code blocks is stored.

In this way, it can be implemented that data of only the sub-blocks that belong to the m code blocks and have the same quantity as the bad sub-blocks is acquired, so that network overheads can be reduced.

As an optional implementation manner, the present invention may be applied to the RS algorithm, the CRS algorithm, the RAID5 technology, and the RAID6 technology.

In the foregoing technical solutions, on a basis of the foregoing embodiment, it is implemented that network transmission is performed in a unit of sub-block, thereby saving a network resource and improving reliability of data storage.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some communication interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present invention. The foregoing storage medium includes: any non-transitory storage medium that can store program code, such as a universal serial bus (USB) flash drive, a removable hard disk, a read-only memory (ROM), a magnetic disk, or an optical disc.

What is claimed is:

1. A method for recovering data in a storage device, wherein the storage device comprises a controller and a plurality of storage units, and wherein the method is performed by the controller and comprises:
   receiving a data stream;
   dividing the data stream into a plurality of data blocks, wherein each data block comprises data that comprises a plurality of bits;
   obtaining a code block using the plurality of data blocks;
   storing the plurality of data blocks and the code block in the plurality of storage units separately;
   determining a position of damaged data from among the plurality of data blocks and the code block;
   obtaining a sub-block from each block in the plurality of data blocks and the code block when there are one or more blocks with the damaged data in the plurality of data blocks and the code block, wherein the sub-block spans from an Mth bit to an Nth bit of the block, wherein the Mth bit and the Nth bit are each positive integers, wherein the Mth bit and the Nth bit are determined according to the position of the damaged data, wherein a number of sub-blocks contains damaged data is no greater than a number of code blocks, and wherein a size of the sub-block is less than a size of each of the plurality of data blocks and the code block; and
   reconstructing data in one or more sub-blocks that contain the damaged data using other sub-blocks with undamaged data.

2. The method according to claim 1, wherein the size of the sub-block is a preset size, and wherein the preset size is a size of a common multiple of a minimum unit for data storage in each of the plurality of data blocks and a minimum unit for data storage in the code block.

3. The method according to claim 1, wherein the size of the sub-block is a preset size, and wherein the preset size takes one sector as a unit and is an integral multiple of a size of one sector.

4. A storage device for recovering data, wherein the storage device comprises a controller and a plurality of storage units, and wherein the controller is configured to:
   receive a data stream;
   divide the data stream into a plurality of data blocks, wherein each data block comprises data that comprises a plurality of bits;
   obtain a code block through calculating the plurality of data blocks;
   store the plurality of data blocks and the code block in the plurality of storage units separately;
   determine a position of damaged data from among the plurality of data blocks and the code block;
   obtain a sub-block from each block in the plurality of data blocks and the code block when there are one or more blocks with the damaged data in the plurality of data blocks and the code block, wherein the sub-block spans from an Mth bit to an Nth bit of the block, wherein the Mth bit and the Nth bit are each positive integers, wherein the Mth bit and the Nth bit are determined according to the position of the damaged data, wherein a number of sub-blocks contains damaged data is no greater than a number of code blocks, and wherein a size of the sub-block is less than a size of each of the plurality of data blocks and the code block; and
   reconstruct data in one or more sub-blocks that contain the damaged data using other sub-blocks with undamaged data.

5. The storage device according to claim 4, wherein the size of the sub-block is a preset size, and wherein the preset size is a size of a common multiple of a minimum unit for data storage in each of the plurality of data blocks and a minimum unit for data storage in the code block.

6. The storage device according to claim 4, wherein the size of the sub-block is a preset size, and wherein the preset size takes one sector as a unit and is an integral multiple of a size of one sector.

7. A non-transitory computer readable storage medium comprising a program code, wherein the program code is configured to be executed by a storage device comprising a controller and a plurality of storage units, and wherein the program code causes the controller to:
   receive a data stream;
   divide the data stream into a plurality of data blocks, wherein each data bock comprises data that comprises a plurality of bits;
   obtain a code block using the plurality of data blocks;
   store the plurality of data blocks and the code block in the plurality of storage units separately;
   determine a position of damaged data from among the plurality of data blocks and the code block;
   obtain a sub-block from each block in the plurality of data blocks and the code block when there are one or more blocks with the damaged data in the plurality of data blocks and the code block, wherein the sub-block spans from Mth bit to an Nth bit of the block, wherein the Mth bit and the Nth bit are each positive integers, wherein the Mth bit and the Nth bit are determined according to the position of the damaged data, wherein a number of sub-blocks contains damaged data is no greater than a number of code blocks, and wherein a size of the sub-block is less than a size of each of the plurality of data blocks and the code block; and
   reconstruct data in one or more sub-blocks that contains the damaged data using other sub-blocks with undamaged data.

8. The non-transitory computer readable storage medium according to claim 7, wherein the size of the sub-block is a preset size, and wherein the preset size is a size of a common multiple of a minimum unit for data storage in each of the plurality of data blocks and a minimum unit for data storage in the code block.

9. The non-transitory, computer readable storage medium according to claim 7, wherein the size of the sub-block is a preset size, and wherein the preset size takes one sector as a unit d is an integral multiple of a size of one sector.

10. The method according to claim 1, wherein each sub-block contains damaged data from only one data block.

11. The method according to claim 1, wherein a maximum number of data blocks n that can be reconstructed is limited by a number of code blocks in according to n≤m, and wherein a maximum number of sub-blocks h that can be reconstructed is limited according to h·m.

12. The storage device according to claim 4, wherein each sub-block contains damaged data from only one data block.

13. The storage device according to claim 4, wherein a maximum number of data blocks n that can be reconstructed is limited by a number of code blocks m according to n≤m, and wherein a maximum number of sub-blocks h that can be reconstructed is limited according to h·m.

14. The non-transitory computer readable storage medium according to claim 7, wherein each sub-block contains damaged data from only one data block.

15. The non-transitory computer readable storage medium according to claim 7, wherein a maximum number of data blocks n that can be reconstructed is limited by a number of code blocks m according to n≤m, and wherein a maximum number of sub-blocks h that can be reconstructed is limited according to h·m.

\* \* \* \* \*